United States Patent [19]

Kamijo et al.

[11] Patent Number: 4,549,059
[45] Date of Patent: Oct. 22, 1985

[54] WIRE BONDER WITH CONTROLLED ATMOSPHERE

[75] Inventors: Atsushi Kamijo; Hitoshi Igarashi, both of Tokyo, Japan

[73] Assignee: NEC Corporation, Tokyo, Japan

[21] Appl. No.: 555,037

[22] Filed: Nov. 23, 1983

[30] Foreign Application Priority Data

Nov. 24, 1982 [JP] Japan ............................ 57-205733
Nov. 24, 1982 [JP] Japan ............................ 57-205734
May 30, 1983 [JP] Japan ............................ 58-95165

[51] Int. Cl.[4] ............................................ B23K 11/22
[52] U.S. Cl. .................................... 219/56.21; 219/68
[58] Field of Search ............... 219/56.1, 56.21, 56.22, 219/68

[56] References Cited

U.S. PATENT DOCUMENTS 4,323,759  4/1982  Edson et al. .................... 219/56.22
4,390,771  6/1983  Kurtz et al. .................... 219/56.21

FOREIGN PATENT DOCUMENTS 138454  10/1979  German Democratic Rep. ... 219/68
2086297  5/1982  United Kingdom ............. 219/56.21

Primary Examiner—Clifford C. Shaw
Attorney, Agent, or Firm—Laff, Whitesel, Conte & Saret

[57] ABSTRACT

In order to bond a fine metal wire of a high tensile strength or a low cost to an electrode of a semiconductor chip and an external lead of a semiconductor device package, either an inert gas or an inert gas containing a predetermined concentration of oxygen is made to flow through a region in which the tip of the fine metal wire is melted by a spark discharge, parallel to the path of the discharge.

14 Claims, 11 Drawing Figures

WIRE BONDER WITH CONTROLLED ATMOSPHERE

BACKGROUND OF THE INVENTION

1. Field of the Invention

The present invention relates to a structure of a wire bonder for connecting electrodes of a semiconductor chip mounted on a package to external leads with fine metal wires.

2. Description of the Prior Art

The connection of a transistor or integrated circuit chip mounted on a package or a lead frame, to the external leads of the package or lead frame are conducted by the steps of: bringing a hydrogen flame close to the tip of a fine metal wire which runs through a capillary, so as to melt the tip of the fine metal wire to prepare a ball-shaped tip; pressing the ball-shaped tip of the metal wire onto an electrode of the chip after the hydrogen flame has been returned to its original position; subsequently moving the capillary to a position above the external lead and bonding the metal wire to the external lead by means of thermocompression bonding technique; and then cutting the metal wire. These steps are conducted automatically so as to increase the production efficiency and speed. If the wire bonding operation is speeded up, the speed of movement of the hydrogen flame must be increased accordingly and the high-speed movement makes the hydrogen flame unstable. Therefore, a spark discharge is used in recent years to melt the tip of the metal wire in place of the hydrogen flame.

Gold of a high purity is conventionally used as the fine metal wire, but since a fine wire of high-purity gold is mechanically weak and is often broken by the high-speed movement of the capillary, a fine wire of gold containing some impurities has been devised to increase its strength for the automatic wire bonder. Because the price of gold has risen, however, the use of a less expensive, fine silver wire is being examined. If this kind of metal wire is molten in air, oxides are grown on the surface of the molten metal, which raise problems such as a reduction in the bonding strength, or an increase in the electrical resistance of the bond portion. Depending upon the quantity of oxides, moreover, the shape of the molten ball may be distorted or its surface roughened to reduce the bonding strength. In order to prevent the oxidation, or limit it to a suitable rate, therefore, the atmosphere in which the tip of the fine metal wire is molten has to be selected. Since this atmosphere should either be inert or contain a low concentration of oxygen, an idea has been conceived of installing the entire wire bonder within a predetermined atmosphere. However, this would make maintenance and inspection of the wire bonder difficult, reducing the workability.

SUMMARY OF THE INVENTION

It is, therefore, an object of the present invention to provide a wire bonder which is able to melt the tip of a metal wire within a controlled atmosphere without installing the entire bonder in a controlled atmosphere.

Another object of the present invention is to provide a wire bonder which is able to control the atmosphere without reducing its workability.

Still another object of the present invention is to provide a wire bonder which is able to conduct wire bonding operations at a high speed.

According to a feature of the present invention, there is provided a wire bonder comprising: a capillary through which a fine metal wire runs; an opposing electrode for establishing a spark discharge between itself and the tip of the metal wire running through the capillary tube; means for letting a controlled gas flow along and in the vicinity of the path of the discharge, parallel to the discharge path; a holding mechanism for holding a package or lead frame on which a semiconductor chip is mounted; and a means for pressing the end of the capillary on either an electrode of the semiconductor chip on the holding mechanism or an external lead of the package or the lead frame.

According to the present invention, the controlled gas is allowed to flow along and in the vicinity of the path of a discharge between a fine wire running through the capillary and the opposing electrode. This makes it possible to melt the tip of the metal wire in the controlled atmosphere to form a ball, even although the wire bonder as a whole is not within that controlled atmosphere. Since the tip of the metal wire is molten in the controlled atmosphere, it is possible to prevent the growth of oxides on the surface of the molten metal, or control the quantity of oxides. As a result, the tip of the metal wire can be bonded firmly to the semiconductor chip and the external lead, with a reduced electrical resistance of the bond portion. In a case where the fine metal wire is made of gold, it is possible to effect a highly reliable bonding operation even if impurities are mixed into the gold to increase the strength of the fine wire, so that such a wire can be suitable for high-speed bonding. It is also possible to bond a fine silver wire which is inexpensive but is liable to oxidation.

The controlled gas flows parallel to the path of the discharge between the capillary and the opposing electrode. As a result, the atmosphere around the tip of the metal wire is precisely controlled with a reduced gas flow rate, and the ball-up shape of the molten tip of metal wire is always spherical. In this point, although the atmosphere around the tip of metal wire can be controlled by sideway flow of gas perpendicular to the discharging path, it has been discovered from inventors' experiments that a considerable flow rate was required to control the atmosphere and to prevent the oxidation of molten ball of the metal wire. With the increasing flow rate, the shape of the molten tip of metal wire became unstable, because of the gas pressure and the unstable discharge.

Since the controlled atmospheric gas flows locally, moreover, not only can the wire bonder have a small size, but also there is no need to seal off the bond portion so that maintenance and inspection can be easily conducted with a high workability.

BRIEF DESCRIPTION OF THE DRAWINGS

The above and further objects, features and advantages of the present invention will become more apparent from the following detailed description of embodiments thereof, taken in conjunction with the accompanying drawings wherein.

DESCRIPTION OF THE PREFERRED EMBODIMENTS

Figure 1:
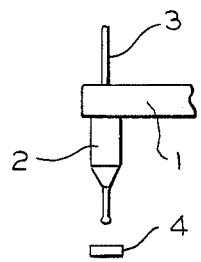
FIGS. 1 to 4 are sectional views of main parts, essential illustrating the wire bonding steps according to an electric torch method in a prior art.
Figure 2:
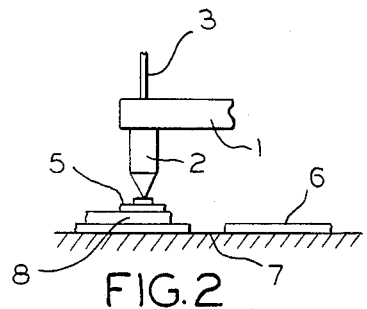
Figure 3:
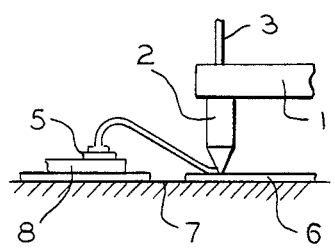

Generally speaking, a wire bonder utilizing an electric torch method using a discharge is equipped with: a capillary through which a fine metal wire runs; an opposing electrode which generates a spark discharge between itself and the tip of the metal wire passing through the capillary; a stage on which either a lead frame or package holding a semiconductor chip is placed; a reel feeding the fine metal wire to the capillary; a discharge generating means for applying high-voltage pulses between the fine metal wire and the opposing electrode to generate the discharge between the tip of metal wire and the opposing electrode; and means for moving the capillary, the opposing electrode, and the stage through predetermined distances at predetermined times. First of all, the tip of a metal wire 3 passing through the capillary 2 is melted to form a ball. For this purpose, as shown in FIG. 1, an arm 1 is moved to bring the leading end of a capillary 2 to a position facing an opposing electrode 4, and a spark discharge is generated between the tip of the metal wire 3 and the opposing electrode 4. The tip of the metal wire 3 is melted by the discharge to form a ball. After this, the arm 1 is quickly moved to bring the capillary 2 above an electrode 5 on a semiconductor chip 8 which has been soldered to a lead frame 6 mounted on a stage 7. The capillary 2 is then moved down to press the ball at the tip of the metal wire 3 onto the electrode 5 to connect the metal wire 3 to the electrode 5. After this, as shown in FIG. 3, the capillary 2 is first moved upward, and then moved to above an external lead of the lead frame 6. The capillary 2 is then moved down to press the metal wire 3 onto the external lead, and the stage 7 is heated to achieve a thermocompression bonding of the metal wire 3 on the external lead. In the next step, shown in FIG. 4, as the capillary 2 is moved upward together with the metal wire 3, the metal wire 3 is cut at the bonded portion or its vicinity. The capillary 2 is moved back to above the opposing electrode 4, and the steps of FIGS. 1 to 4 are repeated so as to connect all the electrodes on the semiconductor chip 8 to the corresponding external leads of the lead frame 6 by the metal wire 3. When the wirings of all the electrodes on the semiconductor chip 8 by the metal wire 3 are ended, the lead frame 6 is moved horizontally to carry the next semiconductor chip to the wire-bonding position on the stage 7, and the steps described above are repeated.

In this type of wire bonding process, the fine wire is conventionally made of pure gold. Since a pure gold wire has a low tensile strength, however, it could break when the capillary 2 is moved at high speed. Especially in recent years, high-speed movements of the capillary 2 have become necessary to improve the production efficiency. In order to satisfy this requirement, an extremely small quantity of an oxidizable element such as beryllium (Be), magnesium (Mg), calcium (Ca), titanium (Ti), aluminum (Al), or manganese (Mn) is added to the gold to increase the tensile strength of the fine gold wire. When fine gold wire containing an impurity is used, oxides of the impurity are deposited on the surface of the molten metal if the wire bonding process is conducted in air. The presence of these oxides would reduce the strength of the bonds with the electrodes 5 of the semiconductor chip 8, or else the failure of the molten metal to become accurately spherical would further reduce the bonding strength. If the fine metal wire is made of silver, production costs would be reduced by the relative inexpensiveness of silver. But since silver oxidizes with the oxygen in air, the molten metal would solidify to make it impossible to ensure a sufficiently strong bond with the electrodes of the semiconductor chip. If a fine metal wire of another metal such as aluminum is used, the oxidization of the molten metal would be more intense so that the bonding strength would be further degraded.

If fine metal wire made of any metal other than pure gold is ued, the atmosphere for melting the tip of the wire must either be composed of an inert gas such as nitrogen to prevent oxidation, or its oxygen content must be precisely controlled to control the oxidation. It is possible to reduce the production cost and to speed up the process by controlling the atmosphere around the molten portion in this way. If the entire wire bonder is placed within a controlled atmosphere, not only is the size of the wire bonder increased, but also the operator cannot touch the wire bonder when it is in operation, so that the maintenance and inspection become difficult and its workability is markedly reduced.

As a means for controlling the atmosphere around the molten portion while maintaining the workability at a high level, the inventor has examined a method of blowing a controlled gas sideways onto the leading end of the capillary. In order to maintain the predetermined atmosphere, a large rate of flow of the atmospheric gas is required, but this makes it difficult for the molten metal to form a sphere. At the same time, moreover, since the direction of the discharge and the direction of flow of the atmosphere are perpendicular to each other, the discharge becomes unstable. This unstable discharge is another cause of the above difficulty.

Figure 4:
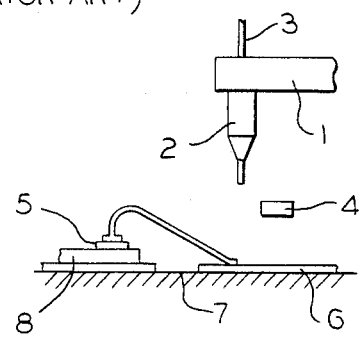
Figure 5:
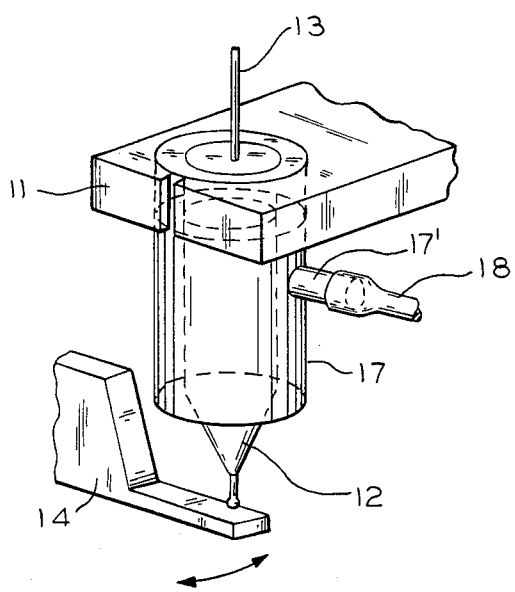
FIG. 5 is a perspective view of both a capillary and an opposing discharge electrode according to a first embodiment of the present invention.

FIG. 5, showing a first embodiment of the present invention, illustrates how the capillary 2 of the wire bonder of FIG. 4 has been improved. The present embodiment is identical to the wire bonder of FIGS. 1 to 4 with the exceptions of the construction of a capillary 12, the fact that the capillary 12 is only able to move in the vertical direction, and the fact that an opposing electrode 14 and a stage (7 in FIG. 4) are movable only in the horizontal directions.

The capillary 12 according to the present embodiment is positioned within a pipe 17 which has a closed upper portion, and the pipe 17 is fixed onto an arm 11. A gas inlet 17′ is formed on the side of the pipe 17, to which is connected a tube 18 for supplying a predetermined atmospheric gas. A fine metal wire 13 is guided so as to pass through the central bore of the capillary 12. The atmospheric gas supplied from the tube 18 flows downward within the pipe 17, parallel to the capillary 12, so that the capillary 12 is surrounded by the downward-flowing atmospheric gas.

To melt the tip of the metal wire 13 protruding from the leading end of the capillary 12, the opposing electrode 14 is first moved to below the capillary 12. The distance between the leading end of the capillary 12 and the opposing electrode 14 is selected to be between 0.8 to 1.2 mm, typically 1.0 mm; and the distance between the tip of the metal wire 13 protruding from the end of the capillary 12 and the opposing electrode 14 is set to be between 0.1 to 0.4 mm, typically 0.2 mm. A pulsed voltage is applied between the capillary 12 and the opposing electrode 14 to generate a spark discharge between the tip of the metal wire 13 and the opposing electrode 14. A suitable pulsed voltage is between 300 to 800 V; typically 400 V. The tip of the metal wire 13 is melted by the spark discharge, and the molten metal forms a ball of spherical shape.

Nitrogen or another inert gas is selected as the atmospheric gas when a fine gold wire containing a small quantity of impurity, or a fine wire of aluminum or copper, is used as the fine metal wire 13. When fine silver wire is used, it could be of pure silver, but it is preferable that the tensile strength of the fine silver wire is increased by making it of silver containing either a single impurity selected from 30 to 200 atomic PPM manganese, 10 to 300 atomic PPM lithium, 10 to 300 atomic PPM magnesium, or 50 to 300 atomic PPM aluminum; or at least two of impurities selected from 5 to 200 atomic PPM manganese, 5 to 300 atomic PPM lithium, 5 to 300 atomic PPM magnesium, and 5 to 300 atomic PPM aluminum, with the total of the additions being within the range of 10 to 300 atomic PPM. The bonding strength of the silver wire containing such impurities becomes higher if the impurities are deposited in the form of oxides on the surface of the molten metal to make the inside pure silver. Therefore, the atmospheric gas should contain 100 to 300 PPM oxygen in an inert gas. When the metal wire is made of pure silver, the oxygen concentration should be controlled to by no more than 100 PPM. In this case, the atmospheric gas could even be just the inert gas.

Since this atmospheric gas is made to flow downward parallel to the capillary 12, in the present embodiment, the surroundings of the capillary 12 are kept within a predetermined atmosphere even for a low flow rate of atmospheric gas. As a result, it is possible to prevent the tip of the metal wire 13 from oxidizing more than necessary, so that the bonding strength is kept strong. Moreover, since the flow of the atmospheric gas is in the same direction as that of the discharge, a stable discharge is obtained so that the shape of the molten metal at the tip of the metal wire 13 can become accurately spherical. This accuracy of the spherical shape is enhanced by the low flow rate of atmospheric gas. Since the capillary 12 is always surrounded by the atmospheric gas, oxidation is restricted at all times between the melting of the tip by the discharge and the bonding of the tip of the electrode of the semiconductor chip. As a result, it is possible to ensure a predetermined bonding strength.

The atmospheric gas is made to flow downward at a speed of between 30 to 400 cm/sec. typically 250 cm/sec. Since, especially in the present embodiment, the capillary 12 is only able to move in the vertical direction, the atmospheric gas is easily made homogeneous around the discharge region, even at a relatively low flow rate. Since the atmospheric gas is made to flow at a rate of about 50 liters/hour, no problem arises even if the gas is not recovered. Despite this, a recovery port of an atmospheric gas-recovering device may be provided below the opposing electrode 14.

FIGS. 6 to 10 each show embodiments in which the atmospheric gas is made to flow upward from an opposing electrode 24-1, 24-2, 24-3, 24-4 or 24-5 toward a capillary 22. In each of these embodiments, the capillary 22 has an internal bore through which a fine metal wire 23 extends, it is fixed onto an arm 21 so that it is carried by the movement of the arm 21 horizontally above a fixed opposing electrode 24-1, 24-2, 24-3, 24-4 or 24-5, an electrode of a semiconductor chip, and an external lead, and is also able to move vertically above the electrode of the semiconductor chip and above the external lead for the wire bonding operations. The opposing electrode 24-1, 24-2, 24-3, 24-4 or 24-5 could be fixed, or it could be moved to a predetermined position together with the capillary 22 only when the discharge is established.

Figure 6:
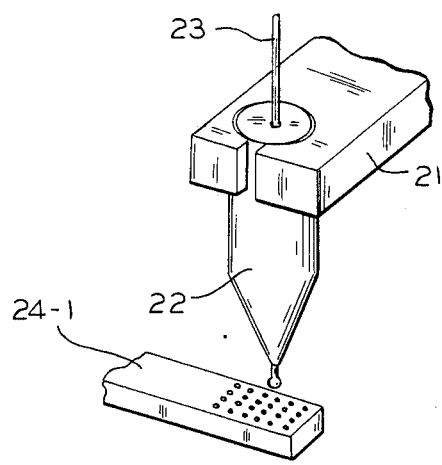
FIGS. 6 to 11 are perspective views of the capillary and the opposing discharge electrode according to second to seventh embodiments of the present invention, respectively.

In the embodiment of FIG. 6, the opposing electrode 24-1 is made hollow so that the controlled atmospheric gas can be made to flow therethrough. The leading end of the opposing electrode 24-1 is formed as a rectangular with a number of holes in its upper side facing the capillary 22. The atmospheric gas passed through the hollow and is released upward through these holes. The flow rate of the atmospheric gas is between 50 to 500 cm/sec, slightly higher than that of the embodiment of FIG. 5. The distances between the surface of the opposing electrode 24-1 and the leading end of the capillary 22 and the tip of the metal wire 23 extending through the capillary 22, and the pulsed voltage applied for the discharge are the same as those of the embodiment of FIG. 5.

Figure 7:
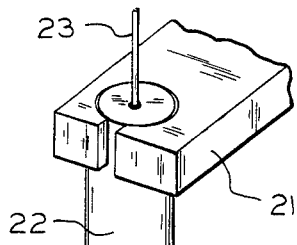

In the embodiment of FIG. 7, the leading end of the opposing electrode 24-2 is formed as a semicylindrical shape with a number of holes in its curved surface. In the present embodiment, the atmosphere is made homogeneous within a wider region, and the discharge is also made stable in the region closest to the capillary 22. When the leading end of the opposing electrode 24-2 is moved horizontally, the predetermined portion of it facing the capillary 22 can be surrounded quickly by the predetermined atmosphere because the atmospheric gas is blown out obliquely forward with respect to the direction of movement.

Figure 8:
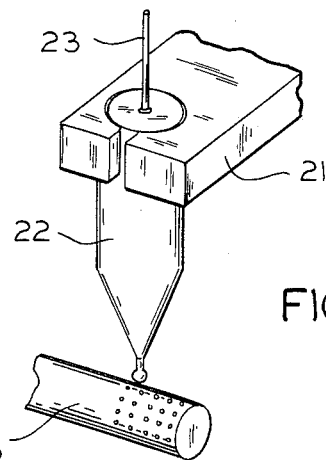

In the embodiment of FIG. 8, the leading end of the opposing electrode 24-3 is formed as a cylindrical shape of a circular cross-section, with a number of holes in its surface portion facing the capillary 22. The present embodiment also enjoys effects similar to those of the embodiment of FIG. 7.

Figure 9:
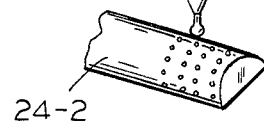
Figure 9:
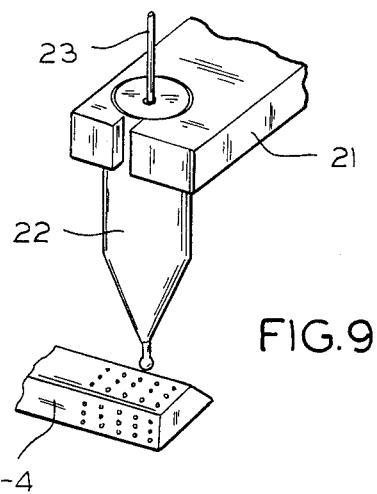

In the embodiment of FIG. 9, the leading end of the opposing electrode 24-4 is formed into a shape with a trapezoidal cross-section. The upper surface and the two side surfaces of the trapezoid have a number of holes. These holes could be provided in the upper surface alone, but if the side surfaces also have holes, the atmospheric gas can be blown out obliquely forward of the direction of movement of the opposing electrode. As a result, the predetermined position facing the capillary 22 can be surrounded quickly by the stable atmosphere.

Figure 10:
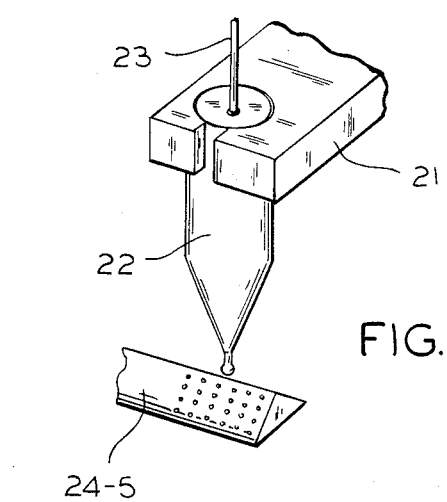

In the embodiment of FIG. 10, the leading end of the opposing electrode 24-5 is formed as a triangular shape with two sloping sides, of which that on the side moved to face the capillary 22 has a gentle slope and has a number of holes. According to this embodiment, the portion facing the capillary 22 can be surrounded quickly by the homogeneous atmosphere.

Figure 11:
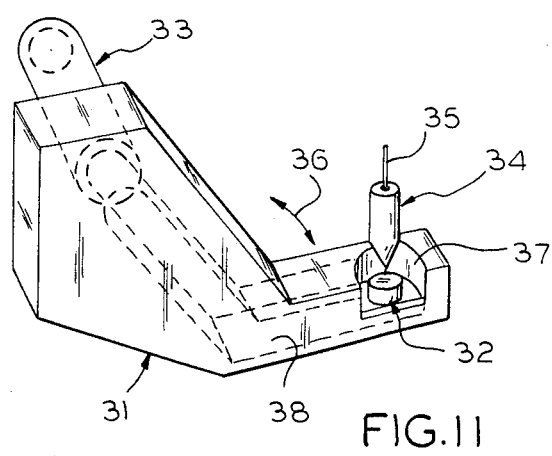

In the embodiment of FIG. 11 as well, the atmospheric gas is made to flow upward to a capillary 34 from around a discharge electrode 32 of an opposing electrode 31. The opposing electrode 31 is rotationally moved in horizontal plane in such a manner that it describes a sector, as indicated by arrows 36, so that it can face the capillary 34 in a predetermined position when the discharge is generated. The opposing electrode 31 is hollowed and has a passage 38 through which the controlled atmospheric gas is made to flow from a tube 33 connected thereto. The leading end of the opposing electrode 31 has formed in it a notch 37 which is U-shaped in plan, and which is of a predetermined depth from the upper surface. The discharge electrode 32 is mounted in the notch 37. The notch 37 is made deep enough that, when the discharge electrode 32 and the leading end of the capillary 34 face each other at a distance of 0.8 to 1.2 mm, it surrounds the leading end of the capillary 34. It is sufficient if just the tip of a fine metal wire 35 passing through the capillary 34 is surrounded by the notch 37, but it is needless to say that if the leading end of the capillary 34 is also surrounded by the notch 37, this can make the atmosphere of the discharge region more stable. The hollow passage 38 in the opposing electrode 31 opens toward a side surface of the notch 37.

Since the discharge region is established within the notch 37 in the present embodiment, the atmosphere can be made stable, and its flow rate can be further reduced. As a result, even if the opposing electrode 31 is moved at high speed, the atmosphere within the discharge region is not disturbed much, so that the wire bonding process can be conducted at high speed.

Thus, according to the present invention, the atmospheric gas is made to flow parallel to the path of the discharge between the tip of metal wire extending through the capillary and the opposing electrode so that only the atmosphere of necessary parts is controlled by the atmospheric gas flowing at a low rate. As a result, the size of the wire bonder is not increased, and its workability is not reduced by the atmospheric control. Since the flow of the atmospheric gas is parallel to the discharge path, it does not obstruct a stable discharge. This stable discharge together with the controlled atmosphere and the low flow rate of the atmospheric gas prevents the oxidation of the molten end of the fine metal wire as much as possible, and ensures an accurately spherical shape of the ball of molten metal. Thus, oxidation of the molten metal can be prevented or controlled so that the metal wire can be made of any desired metal. That is to say, the wire bonding operation can be speeded up because an impurity can be added to gold or silver to increase its tensile strength.

What is claimed is:

1. A wire bonder comprising:
    a capillary having a bore through which a fine metal wire runs;
    an opposing electrode for establishing a discharge between itself and a tip of said metal wire when said capillary is above said opposing electrode;
    a stage for mounting a semiconductor element and an external lead;
    means for applying a high voltage between said capillary and said opposing electrode to establish the discharge;
    means for moving said capillary, said opposing electrode, and said stage relative to each other to bring said capillary above said opposing electrode, then to the surface of said semiconductor element, and finally to the surface of said external lead to connected said metal wire to said semiconductor element and said external lead; and
    means for making a controlled atmospheric gas flow in a direction from said opposing electrode to said capillary and in parallel with the path of the discharge between said opposing electrode and the tip of said metal wire.

2. The wire bonder as claimed in claim 1, wherein a hole is formed in said opposing electrode at the position at which said discharge is generated, said atmospheric gas flowing through said hole toward said capillary.

3. The wire bonder as claimed in claim 2, wherein said hole in said opposing electrode has a depth sufficient to receive therein the tip of said capillary when said discharge is formed.

4. The wire bonder as claimed in claim 1, wherein said opposing electrode provides a portion for forming the discharge at which plural number of holes for blowing out said atmospheric gas.

5. The wire bonder as claimed in claim 4, wherein said opposing electrode moves between a first position at which said discharge formed and a second position at which said discharge is not formed, and wherein said holes in said opposing electrode are so formed that they blow said atmospheric gas obliquely upward to the direction of movement when said opposing electrode moves from said second position to said first position.

6. A wire bonder comprising:
    means for melting the tip of a fine metal wire in response to an electric discharge to form a spherical end at the tip of said metal wire, said melting means including a capillary through which said metal wire is passed perpendicularly and an opposing electrode which is positioned under said capillary when said electric discharge is generated;
    means for bonding said spherical end of said metal wire to an electrode of a semiconductor element;
    means for bonding another portion of said metal wire to a lead member after said spherical end of said metal wire is bonded to the electrode of said semiconductor element; and
    means for making a substantially inert gas flow upwardly from said opposing electrode to said capillary, the flow being parallel with the path of said electric discharge.

7. The wire bonder as claimed in claim 6, wherein said metal wire is made of a metal selected from the group consisting of gold, silver, aluminum, and copper.

8. The wire bonder as claimed in claim 7, wherein said metal wire contains a small quantity of impurity for increasing the tensile strength thereof.

9. The wire bonder as claimed in claim 6, wherein said substantially inert gas is an inert gas containing 100 to 300 PPM oxygen.

10. The wire bonder as claimed in claim 9, wherein said metal wire is made of gold containing a small quantity of impurity for increasing the tensile strength thereof.

11. The wire bonder as claimed in claim 9, wherein said metal wire is made of a metal selected from the group consisting of silver, aluminum, and copper.

12. The wire bonder as claimed in claim 11, wherein said metal wire contains a small quantity of impurity for increasing the tensile strength thereof.

13. The wire bonder as claimed in claim 9, wherein the flow rate of said gas is between 50 to 500 cm/sec.

14. The wire bonder as claimed in claim 9, wherein said opposing electrode includes a hole having a depth which is sufficient to surround the tip of said capillary at a time of said electric discharge, said hole being used for making said substantially inert gas to flow toward said capillary.

* * * * *